(12) United States Patent
Mayer et al.

(10) Patent No.: US 11,186,179 B2
(45) Date of Patent: Nov. 30, 2021

(54) COMPENSATION APPARATUS FOR LEAKAGE CURRENTS

(71) Applicant: Dr. Ing. h.c. F. Porsche Aktiengesellschaft, Stuttgart (DE)

(72) Inventors: Florian Mayer, Freiberg am Neckar (DE); Daniel Spesser, Illingen (DE); Tim Pfizenmaier, Leonberg (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 0 days.

(21) Appl. No.: 17/087,123

(22) Filed: Nov. 2, 2020

(65) Prior Publication Data

US 2021/0129674 A1    May 6, 2021

(30) Foreign Application Priority Data

Oct. 31, 2019  (DE) ...................... 10 2019 129 413.4

(51) Int. Cl.
  *B60L 3/00*    (2019.01)
  *B60L 53/14*   (2019.01)
  *G01R 31/52*   (2020.01)
(52) U.S. Cl.
  CPC ............. *B60L 3/0069* (2013.01); *B60L 53/14* (2019.02); *G01R 31/52* (2020.01)
(58) Field of Classification Search
  CPC ....... B60L 3/0069; B60L 53/14; G01R 31/52; Y02T 10/70
  See application file for complete search history.

(56) References Cited

U.S. PATENT DOCUMENTS

| | | | |
|---|---|---|---|
| 6,388,451 B1 | 5/2002 | Burba et al. | |
| 9,696,743 B1 * | 7/2017 | Treichler | ................ B60L 53/20 |
| 2011/0216451 A1 | 9/2011 | Haines et al. | |
| 2013/0147419 A1 | 6/2013 | Sakai et al. | |
| 2014/0210411 A1 | 7/2014 | Fluxa et al. | |
| 2015/0078051 A1 | 3/2015 | Oswald et al. | |
| 2020/0278401 A1 * | 9/2020 | Kim | ..................... H02H 1/0007 |

FOREIGN PATENT DOCUMENTS

| | | |
|---|---|---|
| DE | 101 39 028 | 5/2002 |
| DE | 11 2011 102 817 | 6/2013 |
| DE | 10 2018 102 122 | 8/2019 |

(Continued)

*Primary Examiner* — Levi Gannon
(74) *Attorney, Agent, or Firm* — Gerald E. Hespos; Michael J. Porco; Matthew T. Hespos

(57) ABSTRACT

A compensation apparatus compensates for leakage currents on conductors that include active conductors. The apparats (20) has a differential current measuring apparatus (22), a power supply unit (60), a first signal generator (33), an output stage (28) and a supply apparatus (39). The differential current measuring apparatus (22) captures a first signal at a first location of the active conductors and supplies it to the first signal generator (33). The first signal characterizes differential current on the active conductors. The first signal generator (33) generates a second signal to compensate for the differential current from the first signal and supplies this second signal to the output stage (28). The output stage (28) injects a compensation current into at least one of the active conductors via the supply apparatus (39) on the basis of the second signal.

16 Claims, 4 Drawing Sheets

(56) References Cited

FOREIGN PATENT DOCUMENTS

| | | |
|---|---|---|
| EP | 2 945 268 | 11/2015 |
| FR | 3 021 816 | 12/2015 |
| JP | 2010-259247 | 11/2010 |
| WO | 2014/048471 | 4/2014 |
| WO | 2015/079161 | 6/2015 |

\* cited by examiner

COMPENSATION APPARATUS FOR LEAKAGE CURRENTS

CROSS REFERENCE TO RELATED APPLICATION

This application claims priority under 35 USC 119 to German Patent Appl. No. 10 2019 129 413.4 filed on Oct. 31, 2019, the entire disclosure of which is incorporated herein by reference.

BACKGROUND

Field of the Invention

The invention relates to a compensation apparatus for compensating for leakage currents, in particular for use in the charging apparatus of a vehicle.

Related Art

Leakage currents are electrical currents that flow under normal operating conditions in an undesirable current path, for example from one of the outer conductors to a protective conductor. Such leakage currents may occur as a result of filter capacitors of a network filter. These filter capacitors are connected, on one side, to a DC voltage path and on the other side to the protective conductor. Other originators of leakage currents are loads, such as heating systems. A countercurrent may be injected so that excessively high leakage currents does not trip a residual current circuit breaker that may be present and/or an FI fuse. This countercurrent compensates for the leakage current and is referred to as a compensation current. DE 101 39 028 A1 compensates for leakage currents by using network voltages L1, L2 that are phase-shifted with respect to one another to produce an outflowing counter-potential. A voltage at the connections L1, L2 is required for this purpose. In addition, the phase difference must be 180°. Compensation is not possible in the case of a phase difference of 120°, as occurs with three-phase current.

FR 3 021 816 B1 shows a battery charging device for an automobile with passive variable compensation.

US 2011/0216451 A1 shows a protective circuit.

US 2014/0210411 A1 shows a compensation system fora battery charging device.

U.S. Pat. No. 6,388,451 B1 shows a system for canceling a leakage current.

Therefore, an object of the invention is to provide a novel compensation apparatus and a novel vehicle having such a compensation apparatus.

SUMMARY

A compensation apparatus is provided for compensating for leakage currents on conductors that have active conductors. The compensation apparatus has a differential current measuring apparatus, a power supply unit, a first signal generation apparatus, an output stage and a supply apparatus. The differential current measuring apparatus is designed to capture a first signal at a first location of the active conductors and to supply the first signal to the first signal generation apparatus. The first signal characterizes the differential current on the active conductors. The first signal generation apparatus is designed to generate a second signal for compensating for the differential current from the first signal and to supply this second signal to the output stage. The power supply unit has an input side connected to at least some of the active conductors and an output side connected to the output stage to supply the output stage with at least one positive voltage and at least one negative voltage. The output stage is designed to inject a compensation current into at least one of the active conductors via the supply apparatus on the basis of the second signal.

The power supply unit enables a compensation current to be injected into a phase or into the neutral conductor, and the compensation apparatus functions for all network connections with or without neutral conductors.

The output stage of one embodiment is in the form of a four-quadrant controller. The supply apparatus is designed for supply on a first active conductor to which a phase can be connected. Additionally, the output stage is designed to enable a compensation current in a first direction or in a second direction opposite the first direction for each phase angle of the phase on the basis of the second signal. As a result, it is possible to react quickly to detected leakage currents, thereby reducing the risk of tripping a residual current protective.

The supply apparatus and the power supply unit of one embodiment interact with the active conductors on opposite sides of the first location. This enables compensation that acts on both sides of the differential current measuring apparatus and enables non-capture of the compensation current in the differential current measuring apparatus.

The conductors of one embodiment can be connected to a supply network on a first side of the first location, and the supply apparatus likewise interacts with the active conductors on the first side of the first location. As a result of the supply on the side of the supply network, the compensation is not captured by the differential current measuring apparatus. The compensation can therefore operate as control and this has proved to be advantageous in comparison with regulation in experiments.

According to one embodiment, the power supply unit is designed to provide the output stage with at least one positive voltage and with at least one negative voltage, which have an absolute value of at least 250 V, preferably at least 300 V and more preferably at least 390 V. These comparatively high voltages also enable good compensation by injecting a compensation current into a phase.

The power supply unit of one embodiment is designed to make it possible to supply voltage to the output stage, in which the at least one positive voltage may simultaneously or alternatively have at least one first positive voltage and one second positive voltage, and in which the at least one negative voltage may simultaneously or alternatively have at least one first negative voltage and one second negative voltage. The absolute value of the first positive voltage is less than the second positive voltage, and the absolute value of the first negative voltage is less than the second negative voltage. The possibility of different positive and negative voltages advantageously enables the output stage to operate both in the case of supply to a phase and in the case of supply to a neutral conductor.

A supply network detection apparatus may be assigned to the compensation apparatus. The supply network detection apparatus may be designed to generate a third signal characterizing the supply network, and the compensation apparatus may be designed to operate the output stage either with the first positive voltage and the first negative voltage or with the second positive voltage and the second negative voltage on the basis of the third signal. A suitable positive or negative voltage can be automatically selected or generated by taking into account the third signal.

The power supply unit may have at least one voltage regulator that is designed to regulate an output voltage of the power supply unit to a variably predefinable desired voltage value. An adjustable regulator can provide different voltages, and it is possible to set a voltage suitable for the respective supply.

The compensation apparatus may be designed to predefine the desired voltage value on the basis of the supply network connected to the conductors. The predefinition can therefore be automatically adapted to the supply network.

The power supply unit may have at least two regulators for generating the first positive voltage and the second positive voltage. The at least two regulators may be different regulator types. For example, the at least two regulators for generating the first positive voltage and the second positive voltage may have a linear regulator and a switching regulator.

The power supply unit also or alternatively may have at least two regulators for generating the first negative voltage and the second negative voltage. These at least two regulators may be different regulator types. Different regulator types, such as linear regulators or switching regulators, each have advantages for particular voltage ranges, and the provision of plural regulator types therefore enables efficient operation. For example, linear regulators are advantageous for high output voltages, and switching regulators are advantageous for low output voltages. The two regulator types therefore positively complement one another.

The supply apparatus may be designed for supply on a first active conductor, on which first active conductor a phase with a voltage amplitude is present, and in which the power supply unit is designed to provide a positive voltage and a negative voltage, the absolute values of which are each greater than the voltage amplitude. As a result of the provision of such positive and negative voltages, the output stage can intervene in both directions at any time.

The amplifier and the power supply unit may be designed to enable the compensation current to be supplied both to a conductor connected to a phase and to a conductor connected to a neutral conductor. The requirements when supplying the neutral conductor or the phase are very different, and it is advantageous if the compensation apparatus enables both variants.

A vehicle with a charging apparatus for a traction battery charging apparatus also is provided and has a rectifier and a traction battery connected directly or indirectly to the rectifier. The traction battery is coupled galvanically to the active conductors. The charging apparatus also has a compensation apparatus as described above. The vehicle with such compensation for leakage currents is particularly advantageous because the leakage currents can be detected by virtue of the galvanic coupling in the supply network.

Further details and advantageous developments of the invention emerge from the exemplary embodiments described below and illustrated in the drawings and should not be understood as a restriction of the invention.

DETAILED DESCRIPTION

Figure 1:
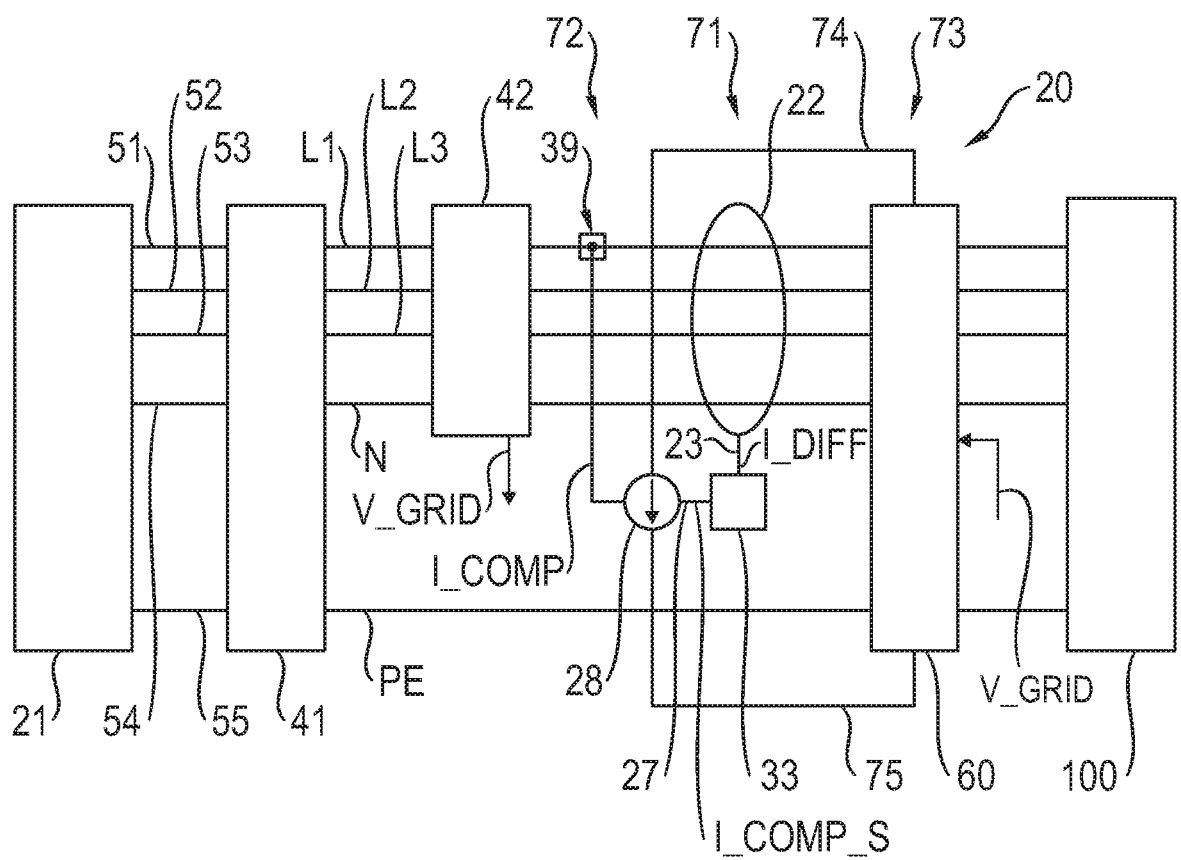
FIG. 1 shows an exemplary embodiment of a compensation apparatus having a power supply unit, an output stage and a supply apparatus.

FIG. 1 shows an exemplary embodiment of a compensation apparatus 20. Five conductors 51, 52, 53, 54 and 55 are provided and are supplied by a schematically illustrated supply network 21. In the case of a three-phase network, the conductors 51 to 53, for example, can be connected to the outer conductors (phases) L1, L2 and L3. The conductor 54 is connected to the neutral conductor N, and the conductor 55 is connected to the protective conductor PE. The conductors needed to conduct the current, for example the conductors 51 to 53 for the outer conductors L1, L2, L3 of the supply network and the conductor 54 for the neutral conductor N of the supply network, are referred to as active conductors. In the case of a single-phase connection, it is not firmly specified in Germany, for example, to which conductor the phase L1 is connected and to which conductor the neutral conductor N is connected. Without an additional circuit, the phase L1 can therefore be connected to the line 51 and the neutral conductor N can be connected to the line 54, or vice versa, for example. In contrast, the protective conductor PE is usually permanently assigned, here to the conductor 55.

An EMC filter 41 which smooths the power supply via coils and capacitors and reduces the undesirable interference radiation, for example, is illustrated. The EMC filter 41 may also be in the form of a network filter.

A supply network detection apparatus 42 is preferably provided and is designed to make it possible to detect the connected supply network 21 and to generate a network detection signal V_GRID. It may be, for example, a single-phase network, a three-phase network, a US supply network of the "split phase" type or another network. The supply network detection apparatus 42 can detect the connected supply network 21, for example on the basis of the voltage profile of the phases.

A differential current measuring apparatus 22 measures the differential current of the active conductors 51 to 54. The differential current measuring apparatus 22 may be, for example, in the form of a summation current transformer, in particular in the form of a winding around the active conductors 51 to 54. If no fault currents or leakage currents occur, the sum of the currents through the conductors 51 to 54, and therefore also the current through the winding, is zero. In contrast, if a leakage current flows from the phase L1 to the protective conductor PE via a Y capacitor of a filter (not illustrated) to the right of the differential current measuring apparatus ("on the vehicle side"), the differential current measuring apparatus 22 determines the resultant differential current. It is also possible to separately measure, for example, the summation current through the conductors 51 to 53, on the one hand, and through the conductor 54, on the other hand, and to then calculate the sum or difference between the two values, depending on the respective winding direction. The signal I_DIFF from the differential current measuring apparatus 22 is supplied to a signal generation apparatus 33 via a line 23. The signal generation apparatus 33 generates a signal I_COMP_S for a suitable compensation current from the differential current signal I_DIFF. This signal I_COMP_S is supplied to an output stage 28 via a line 27, and the output stage 28 generates a corresponding compensation current I_COMP. For this purpose, the output stage 28 is connected to a supply apparatus 39, which supply apparatus 39, together with the output stage 28, enables a compensation current between at least one of the active conductors 51, 52, 53, 54, on the one hand, and the protective conductor PE 55, on the other hand.

The supply apparatus 39 can perform the supply, for example, by means of capacitive coupling, by means of inductive coupling or by means of galvanic coupling.

The output stage 28 is preferably a linear output stage.

As a result of the use of a power supply unit 60, a compensation current can be injected even when a voltage of 0 volts or, for example, +/−0.5 volts is applied to the respective outer conductor.

The output stage 28 is connected to a power supply unit 60 via a line 74 and a line 75, wherein the power supply unit 60 preferably provides a positive voltage via the line 74 and a negative voltage via the line 75. The supply for the output stage 28 is therefore preferably bipolar. The power supply unit 60 has a PE reference to the line 55 and therefore enables a current from or to the protective conductor PE.

The network detection signal V_GRID is preferably supplied to the power supply unit.

A load 100, for example a rectifier and a traction battery, is provided downstream of the power supply unit 60.

A power supply unit is a device or an assembly for supplying energy to devices or assemblies which require voltages and currents other than those provided by the power supply system. The output voltage and the maximum output current can be firmly set or variable.

The electronically active (that is to say amplifying) stage of a power amplifier, before the amplified signal reaches the load, is referred to as the output stage. The entire device or the "power amplifier" assembly is often also referred to as an output stage.

The output stage 28 is preferably in the form of a four-quadrant controller, that is to say, for example if the line 51 is connected to a phase L1, it respectively enables a current from the conductor 51 to the protective conductor 55 or from the protective conductor 55 to the conductor 51 both in the positive half-cycle and in the negative half-cycle. As a result, the leakage current can be compensated for both in the positive half-cycle and in the negative half-cycle of the phase L1.

The differential current measuring apparatus 22 captures the differential current signal I_DIFF at a first location 71 of the active conductors 51, 52, 53, 54. The supply apparatus 39 interacts with the active conductors 51, 52, 53, 54 at a location 72, and the power supply unit 60 interacts with the conductors 51, 52, 53, 54, 55 at a location 73. The locations 72 and 73 are on opposite sides of the first location 71, and the compensation for the leakage current is not captured by the differential current measuring apparatus 22. As a result, the compensation for the leakage current does not act as regulation to a voltage of zero. In the case of complete compensation for the leakage current, the signal I_DIFF is therefore not necessarily zero.

Experiments have revealed that regulation can result in oscillations and, as a result, a poorer result can occur than during control. In principle, it is also possible to monitor the compensation current I_COMP by measuring the current in the supply apparatus 39. It is then possible to monitor whether the current I_COMP corresponds to the desired current.

Compensation can be carried out, in principle, in any of the active conductors 51, 52, 53, 54. In the case of supply networks 21 having a neutral conductor N, compensation is preferably carried out in the neutral conductor N since a low voltage (ideally 0 volts) is applied to the latter.

However, there are also supply networks 21, such as the US split phase network, in which a neutral conductor N is not provided. The US split phase network has two connections HOT1, HOT2. The first connection HOT1 carries 120 V AC, and the second connection HOT2 carries 120 V AC which is phase-shifted through 180° with respect to HOT1.

So that the output stage 28 can operate as a four-quadrant controller, the power supply unit 60 must provide a positive voltage on the line 74 which is greater than the voltage at the supply apparatus 39, and the power supply unit 60 must provide a voltage on the line 75 which is more negative or the absolute value of which is greater than the voltage at the supply location of the supply apparatus 39 or on the line 51 in the exemplary embodiment. If the supply apparatus 39 is connected to the neutral conductor N, a voltage of the power supply unit 60 of +20 volts and −20 volts, for example, is suitable for supplying the compensation current.

In contrast, higher voltages are required when supplying a phase L1. The voltage on the phase L1 has an amplitude A and a phase angle phi. The following is true $$L1 = A\sin(\text{phi}) \tag{1}$$

The absolute value of the voltage of the power supply unit 60 is preferably greater than the amplitude of the voltage on the phase L1 or L2, L3 both on the positive side 74 and on the negative side 75. As a result, a current can be injected into the phase L1 in both directions at any time.

The power supply unit 60 is preferably designed to provide the output stage 28 with at least one voltage having an absolute value of at least 250 volts, preferably at least 390 volts. Both a corresponding positive voltage and a negative voltage are advantageously provided.

The power supply unit 60 is preferably designed to make it possible to provide a first positive voltage and a second positive voltage at the same time (via a plurality of lines) or alternatively (via one or more lines), wherein the first positive voltage is less than the second positive voltage. For example, +20 volts can be provided as the first positive voltage and +400 volts can be provided as the second positive voltage. As a result, the first positive voltage can be used when supplying the compensation current to the neutral conductor N, and the second positive voltage can be used when supplying one of the phases L1, L2, L3.

The use of a lower positive voltage for supplying the neutral conductor N is advantageous since the compensation current I_COMP is, for example, 20 milliamperes or 60 milliamperes, and the provision of such a low compensation current for a voltage difference of approximately 400 volts is difficult to control. In addition, high losses occur in this case. Conversely, a compensation current I_COMP cannot be injected into one of the phases L1, L2, L3 or can be injected only at particular times if the voltage provided by the power supply unit 60 is +/−20 volts and the amplitude of the phase L1 is 230 volts, for example.

In the same manner, the power supply unit is preferably designed to also provide a first negative voltage with a lower absolute value (for example −20 volts) and a second negative voltage with a higher absolute value (for example −400 volts) for the negative voltage.

In order to be able to reliably inject a compensation current at any time, the power supply unit 60 is preferably designed to provide a voltage, the absolute value of which is at least occasionally greater than the voltage amplitude A on the active conductor 51, 52, 53, 54 with which the supply apparatus 39 interacts.

The signal I_COMP_S for the compensation current I_COMP is calculated, for example, by determining the frequency spectrum of the signal I_DIFF, wherein a frequency range of 20 Hz to 300 kHz may be sufficient, for example. The frequency spectrum contains corresponding amplitudes, and the signal I_COMP_S is generated with a phase shift of 180° (in phase opposition) in order to effect appropriate compensation. Other calculations in which the integral is calculated are also possible.

Figure 2:
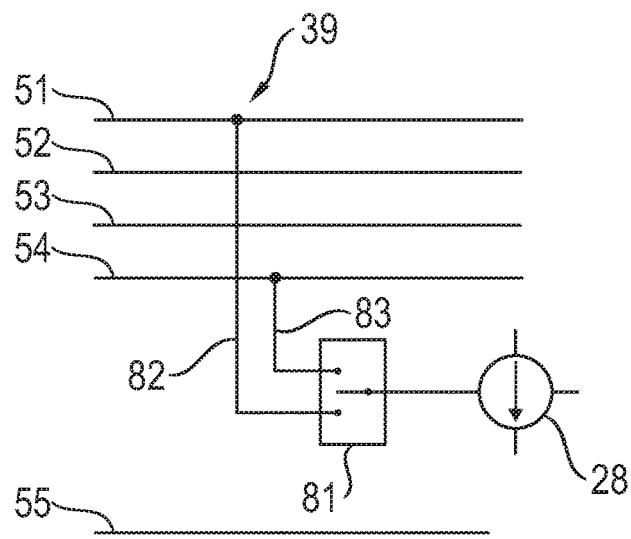
FIG. 2 shows a supply apparatus for a compensation current.

FIG. 2 shows a further exemplary embodiment of the supply apparatus 39 which additionally has a switching apparatus 81. The switching apparatus 81 is connected, on the input side, to the output stage 28 and makes it possible to change over the supply point via two lines 82, 83 which make it possible to supply the active conductors 51 and 54. If there is a neutral conductor N on one of the conductors 51, 54, the switching apparatus 81 makes it possible to select the appropriate conductor for supply. The changing over of the switching apparatus 81 is preferably effected automatically on the basis of the supply network 21 detected by the supply network detection apparatus 42 (cf. FIG. 1).

Figure 3:
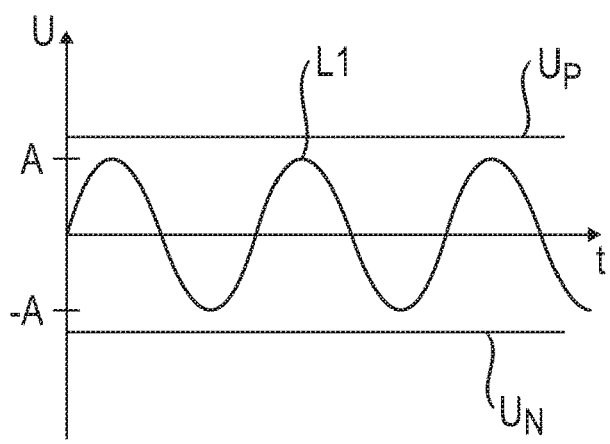
FIG. 3 shows a voltage/time graph for a phase and a suitable supply voltage for supplying the phase.

FIG. 3 shows a graph in which the voltage U is plotted against the time t. The sinusoidal voltage profile on the phase L1 with an amplitude A, which has a sinusoidal profile between a voltage A and a voltage −A according to equation (1), is shown. In addition, a positive voltage $U_P$ and a negative voltage $U_N$, which are provided by the power supply unit 60 via the lines 74, 75, cf. FIG. 1, are also depicted by way of example. Both the absolute value of the voltage $U_P$ and the absolute value of the voltage $U_N$ are higher than the value of the amplitude A, and a compensation current can therefore be injected into the phase L1 both in the positive half-cycles and in the negative half-cycles of the phase U1. If the positive half-cycles are considered, a current is easily possible from the phase L1 to the protective conductor PE even without a higher voltage $U_P$, for example by connecting the phase L1 to the protective conductor PE via a switch. However, a current from the protective conductor PE to the phase L1 is possible only when the voltage $U_P$ is greater than the instantaneous voltage of the phase L1.

Figure 4:
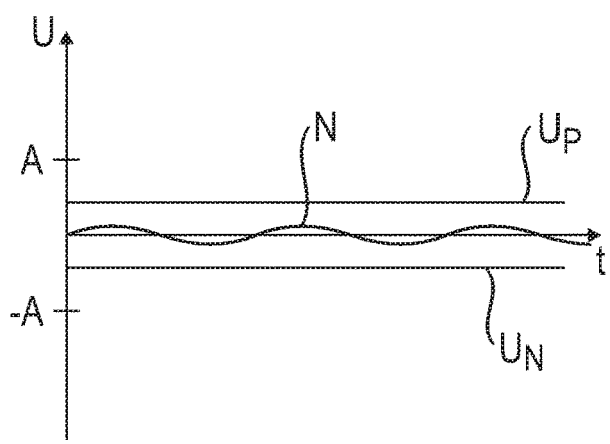
FIG. 4 shows a voltage/time graph for a neutral conductor and a suitable supply voltage for supplying the neutral conductor.

FIG. 4 is a graph corresponding to FIG. 3, but for supplying a neutral conductor N. The voltage U on the neutral conductor N is 0 volts or possibly a low value of, for example, +0.5 volts or −0.5 volts. It is therefore not necessary to set the voltages $U_P$ and $U_N$ of the power supply unit 60 from FIGS. 1 to +400 volts and −400 volts to be able to inject a predefined positive or negative current into the neutral conductor N at any time. The power supply unit 60 (cf. FIG. 1) therefore preferably provides a lower voltage $U_P$ or $U_N$ for the case of supplying the neutral conductor N, the absolute value of which is below the amplitude A of the phase L1, for example.

Figure 5:
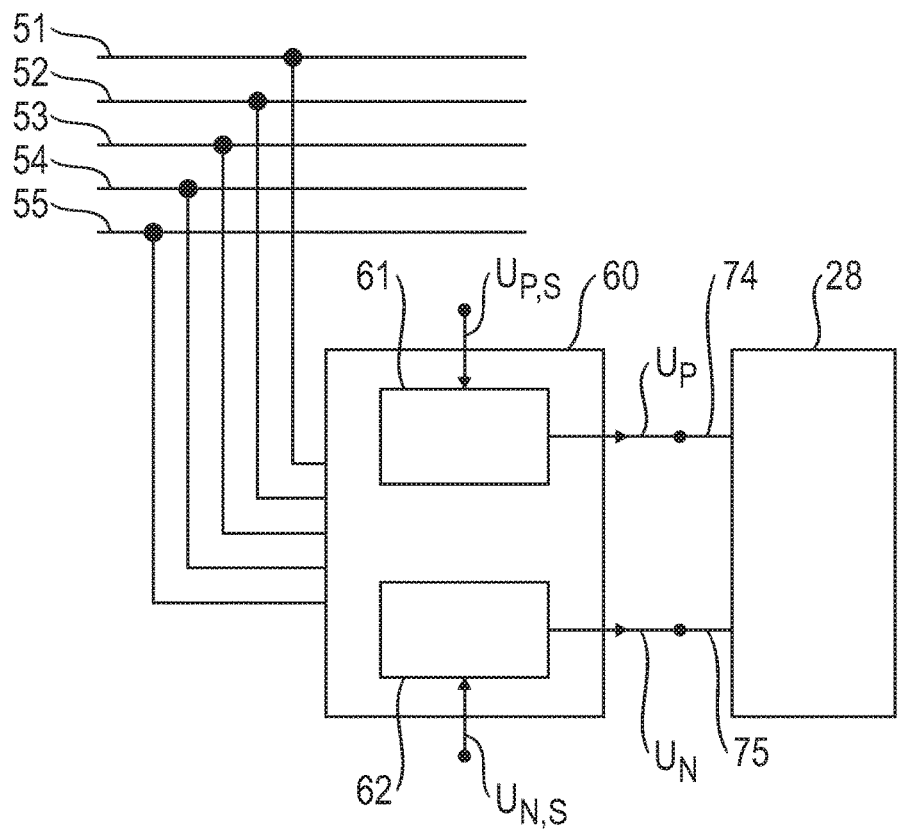
FIG. 5 shows an embodiment of the power supply unit from FIG. 1.

FIG. 5 shows a detailed view of the power supply unit 60.

In the exemplary embodiment, the power supply unit 60 is connected to all conductors 51, 52, 53, 54, 55 and has a regulator 61 and a regulator 62 which are preferably in the form of voltage regulators and regulate the output voltages $U_P$ and $U_N$ of the power supply unit 60, which are output via the lines 74, 75, to variably predefinable desired voltage values $U_{P,S}$, $U_{N,S}$. The desired voltage values $U_{P,S}$ and $U_{N,S}$ are preferably predefined by a control apparatus—not illustrated—on the basis of the supply network 21 detected by the supply network detection apparatus 42 from FIG. 1. As a result, the output stage 28 can operate with an input voltage suitable for the respective supply network 21. For this purpose, a first positive voltage and a first negative voltage with low absolute values are generated when supplying the neutral conductor N and a second positive voltage and a second negative voltage with higher absolute values are generated when supplying one or more of the phases L1, L2, L3.

Figure 6:
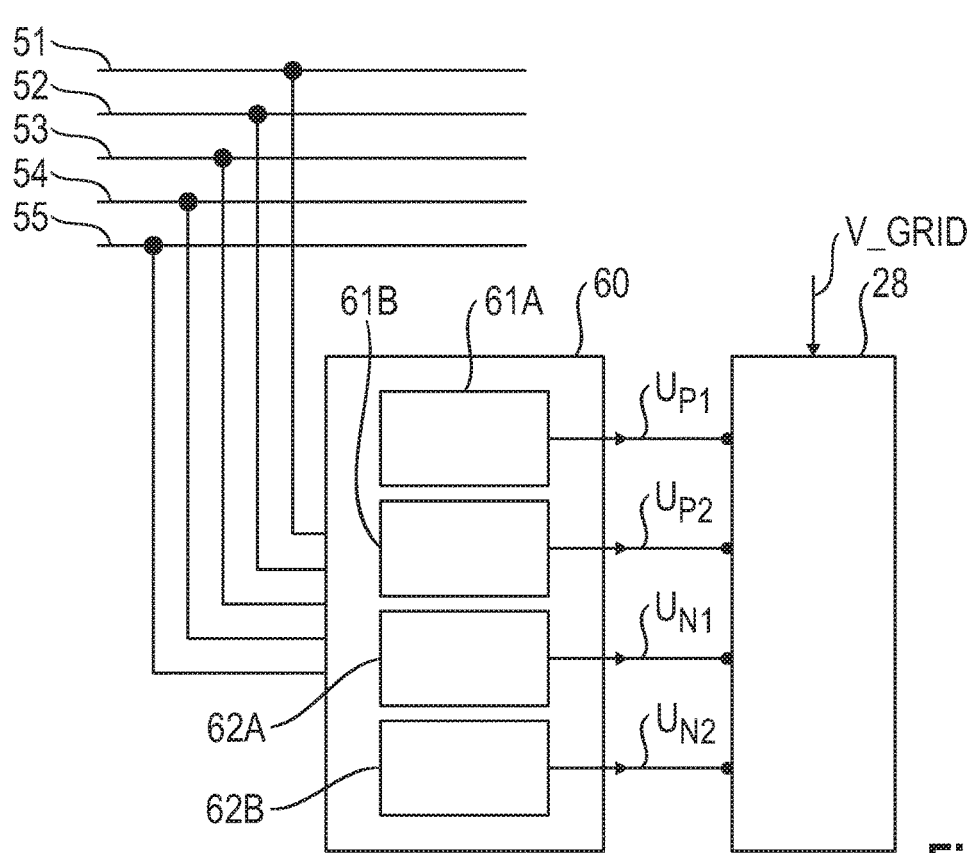
FIG. 6 shows a further embodiment of the power supply unit from FIG. 1.

FIG. 6 shows a further exemplary embodiment of the power supply unit 60. Like in FIG. 5, the power supply unit 60 is connected to the conductors 51, 52, 53, 54 and 55. The power supply unit 60 has a first regulator 61A for generating a first positive voltage $U_{P1}$, a second regulator 61B for generating a second positive voltage $U_{P2}$, a third regulator 62A for generating a first negative voltage $U_{N1}$ and a fourth regulator 62B for generating a second negative voltage $U_{N2}$. The first positive voltage $U_{P1}$ is less than the second positive voltage $U_{P2}$, and the absolute value of the first negative voltage $U_{N1}$ is less than the second negative voltage $U_{N2}$. The power supply unit 60 therefore simultaneously or alternatively generates at least two positive voltages and at least two negative voltages in each case from the supply network 21 (cf. FIG. 1) connected to the conductors 51, 52, 53 and 54 and supplies them to the output stage 28. The regulators 61A, 61B, 62A, 62B are preferably voltage regulators.

The regulators 61A and 62A for the voltages $U_{P1}$ and $U_{N1}$ with low absolute values preferably are switching regulators, and the regulators 61B, 62B for the voltages $U_{P2}$ and $U_{N2}$ with higher absolute values preferably are linear regulators. Linear regulators function well and with high efficiency if the input voltage and the output voltage are not too different. In contrast, switching regulators have comparatively high efficiency at low output voltages. In the case of the linear regulator, the voltage between the phases L1 and L2 can be used as the output voltage, for example at predefined times, via a rectifier, for charging a capacitor or storage element, the absolute value of which voltage is greater than the amplitude of the phase L1. The output voltage can then be lowered if necessary via the linear regulator.

The network detection signal V_GRID is preferably supplied to the output stage 28.

Figure 7:
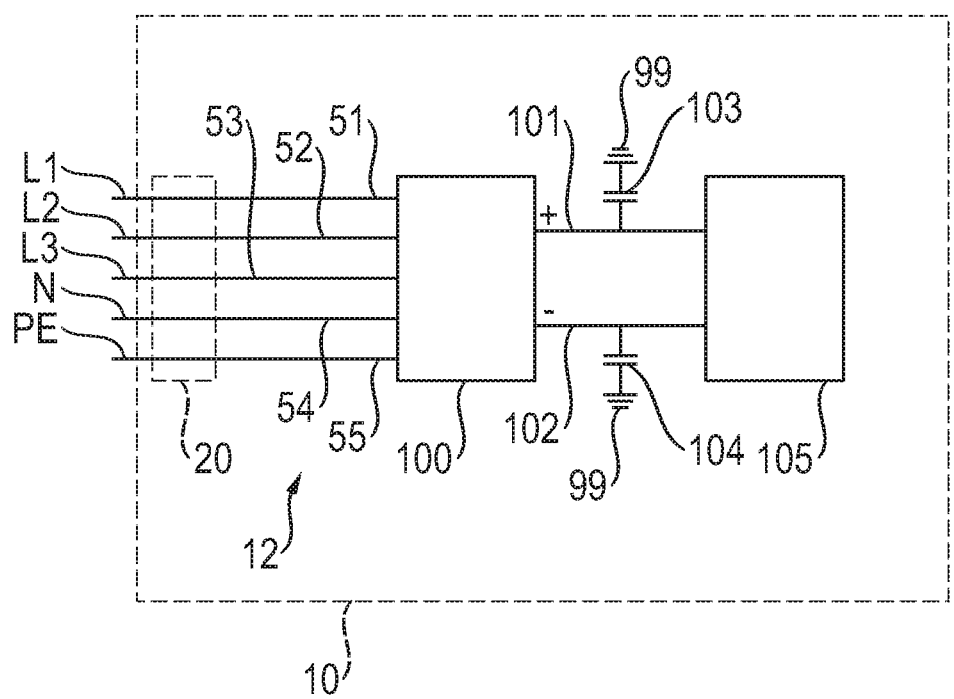
FIG. 7 shows a vehicle having a traction battery and a compensation apparatus according to FIG. 1.

FIG. 7 shows an exemplary embodiment of the use of the conductors 51 to 55 with the schematically indicated compensation apparatus 20 in a vehicle 10, in particular in an electric vehicle or a hybrid vehicle. The conductors 51 to 53 (phase conductors or outer conductors), 54 (neutral conductor N) and the conductor 55 (protective conductor PE) are connected to a rectifier (AC/DC converter) 100 as loads, and two conductors 101 (+) and 102 (−), on which a DC voltage is present, are provided at the output of the rectifier 100. The arrangement can therefore be used as a charging apparatus 12. The conductor 101 is connected to the protective conductor 99 via a capacitor 103, and the conductor 102 is connected to the protective conductor 99 via a capacitor 104. The conductors 101, 102 are connected to a load 105, for example a traction battery, directly or indirectly (for example via an additional DC/DC converter). The capacitors 103, 104 act as EMC filters or network filters and are also referred to as Y capacitors or filter capacitors. During operation, a current can flow to the protective conductor 99 (PE) via the capacitors 103, 104. Since the voltage on the conductors 101, 102 is generated via the current through the active conductors L1, L2, L3 and N, the leakage current to the protective conductor 99 results in a differential current in the active conductors which can result in tripping of a fuse or a residual current circuit breaker of the supply connection if a predefined limit value is exceeded. Conventional limit values of the residual current circuit breakers in the supply networks are, for example, 5 mA or 20 mA or 30 mA.

As a result of the compensation apparatus 20, the leakage currents can be compensated for to the extent that the residual current circuit breaker of the supply network does not trip during normal operation on account of the limit value for leakage currents being exceeded.

This is advantageous, in particular, in charging apparatuses 12 for electric vehicles or hybrid vehicles which have galvanic coupling between the DC intermediate circuit 101, 102 and the conductors 51 to 54 or between the load 105 and the conductors 51 to 54. Unlike in vehicles with DC isolation, as may be the case, for example, in vehicles with transformers in the rectifier 100 or in a DC/DC converter, the leakage currents are added in the case of galvanic coupling and are therefore visible in the supply network. Therefore, the use of the compensation apparatus 20 is particularly advantageous in vehicles with galvanic coupling.

Numerous alterations and modifications are naturally possible within the scope of the present invention.

What is claimed is:

1. A compensation apparatus for compensating for leakage currents on conductors that include active conductors, the compensation apparatus comprising: a differential current measuring apparatus, a power supply unit, a first signal generation apparatus, an output stage and a supply apparatus, wherein:
   the differential current measuring apparatus is designed to capture a first signal at a first location of the active conductors and to supply the first signal to the first signal generation apparatus, the first signal characterizing a differential current on the active conductors,
   the first signal generation apparatus further being designed to generate a second signal for compensating for the differential current from the first signal and to supply the second signal to the output stage,
   the power supply unit has an input side connected to at least some of the active conductors and has an output side connected to the output stage to supply the output stage with at least one positive voltage and at least one negative voltage,
   the output stage is designed to inject a compensation current into at least one of the active conductors via the supply apparatus on the basis of the second signal, and
   the output stage is a four-quadrant controller, the supply apparatus is designed for supply on a first active conductor, to which first active conductor a phase can be connected, and in which the output stage is designed to enable a compensation current in a first direction or in a second direction opposite the first direction for each phase angle of the phase on the basis of the second signal.

2. The compensation apparatus of claim 1, wherein the power supply unit is designed to make it possible to supply voltage to the output stage,
   the at least one positive voltage may simultaneously or alternatively have at least one first positive voltage and one second positive voltage,
   the at least one negative voltage may simultaneously or alternatively have at least one first negative voltage and one second negative voltage,
   the absolute value of the first positive voltage is less than the second positive voltage, and the absolute value of the first negative voltage is less than the second negative voltage.

3. The compensation apparatus of claim 2, further comprising a supply network detection apparatus that is designed to generate a third signal characterizing the supply network, and the compensation apparatus is designed to operate the output stage either with the first positive voltage and the first negative voltage or with the second positive voltage and the second negative voltage on the basis of the third signal.

4. The compensation apparatus of claim 2, wherein the power supply unit has at least one voltage regulator that regulates an output voltage of the power supply unit to a variably predefinable desired voltage value.

5. The compensation apparatus of claim 4, designed to predefine the desired voltage value on the basis of the supply network connected to the conductors.

6. The compensation apparatus of claim 2, wherein the power supply unit has at least two regulators for generating the first positive voltage and the second positive voltage, the at least two regulators are in the form of different regulator types.

7. The compensation apparatus of claim 6, wherein the at least two regulators for generating the first positive voltage and the second positive voltage have a linear regulator and a switching regulator.

8. A vehicle comprising:
   a traction battery;
   active conductors galvanically coupled to the traction battery; and
   a charging apparatus for the traction battery, the charging apparatus having a rectifier connected directly or indirectly to the traction battery and the compensation apparatus of claim 1.

9. The compensation apparatus of claim 1, wherein the power supply unit provides the output stage with at least one positive voltage and at least one negative voltage that have an absolute value of at least 250 V.

10. The compensation apparatus of claim 1, wherein the output stage and the power supply unit are designed to enable the compensation current to be supplied both to a conductor connected to a phase and to a conductor connected to a neutral conductor.

11. A compensation apparatus for compensating for leakage currents on conductors that include active conductors, the compensation apparatus comprising: a differential current measuring apparatus, a power supply unit, a first signal generation apparatus, an output stage and a supply apparatus, wherein:
   the differential current measuring apparatus is designed to capture a first signal at a first location of the active conductors and to supply the first signal to the first signal generation apparatus, the first signal characterizing a differential current on the active conductors,
   the first signal generation apparatus further being designed to generate a second signal for compensating for the differential current from the first signal and to supply the second signal to the output stage,
   the power supply unit has an input side connected to at least some of the active conductors and has an output side connected to the output stage to supply the output stage with at least one positive voltage and at least one negative voltage,
   the output stage is designed to inject a compensation current into at least one of the active conductors via the supply apparatus on the basis of the second signal, and the supply apparatus and the power supply unit interact with the active conductors on opposite sides of the first location.

12. The compensation apparatus of claim 11, wherein the output stage is a four-quadrant controller, the supply apparatus is designed for supply on a first active conductor, to which first active conductor a phase can be connected, and in which the output stage is designed to enable a compensation current in a first direction or in a second direction opposite the first direction for each phase angle of the phase on the basis of the second signal.

13. A compensation apparatus for compensating for leakage currents on conductors that include active conductors, the compensation apparatus comprising: a differential current measuring apparatus, a power supply unit, a first signal generation apparatus, an output stage and a supply apparatus, wherein:

the differential current measuring apparatus is designed to capture a first signal at a first location of the active conductors and to supply the first signal to the first signal generation apparatus, the first signal characterizing a differential current on the active conductors, the first signal generation apparatus further being designed to generate a second signal for compensating for the differential current from the first signal and to supply the second signal to the output stage, the power supply unit has an input side connected to at least some of the active conductors and has an output side connected to the output stage to supply the output stage with at least one positive voltage and at least one negative voltage, the output stage is designed to inject a compensation current into at least one of the active conductors via the supply apparatus on the basis of the second signal, and the conductors can be connected to a supply network on a first side of the first location, and wherein the supply apparatus interacts with the active conductors on the first side of the first location.

14. The compensation apparatus of claim 13, wherein the power supply unit provides the output stage with at least one positive voltage and at least one negative voltage that have an absolute value of at least 250 V.

15. The compensation apparatus for compensating for leakage currents on conductors that include active conductors, the compensation apparatus comprising: a differential current measuring apparatus, a power supply unit, a first signal generation apparatus, an output stage and a supply apparatus, wherein:

the differential current measuring apparatus is designed to capture a first signal at a first location of the active conductors and to supply the first signal to the first signal generation apparatus, the first signal characterizing a differential current on the active conductors, the first signal generation apparatus further being designed to generate a second signal for compensating for the differential current from the first signal and to supply the second signal to the output stage, the power supply unit has an input side connected to at least some of the active conductors and has an output side connected to the output stage to supply the output stage with at least one positive voltage and at least one negative voltage, the output stage is designed to inject a compensation current into at least one of the active conductors via the supply apparatus on the basis of the second signal, and the supply apparatus is designed for supply on a first active conductor, a phase with a voltage amplitude, and in which the power supply unit is designed to provide a positive voltage and a negative voltage, the absolute values of which are each greater than the voltage amplitude.

16. The compensation apparatus of claim 15, wherein the output stage and the power supply unit are designed to enable the compensation current to be supplied both to a conductor connected to a phase and to a conductor connected to a neutral conductor.

* * * * *